Aug. 15, 1972 H. C. CHANG ET AL 3,684,592

PASSIVATED SURFACES AND PROTECTIVE COATINGS FOR SEMICONDUCTOR DEVICES AND PROCESSES FOR PRODUCING THE SAME

Filed Sept. 30, 1969 2 Sheets-Sheet 1

WITNESSES

Theodore F. Wrobel

Donald M. Winegar

INVENTORS
Hung C. Chang and
John W. Ostroski

BY Frederick Shapoe
ATTORNEY

United States Patent Office 3,684,592

Patented Aug. 15, 1972

3,684,592

PASSIVATED SURFACES AND PROTECTIVE COATINGS FOR SEMICONDUCTOR DEVICES AND PROCESSES FOR PRODUCING THE SAME

Hung Chi Chang, Monroeville, and John W. Ostroski, Pittsburgh, Pa., assignors to Westinghouse Electric Corporation, Pittsburgh, Pa.

Filed Sept. 30, 1969, Ser. No. 862,372
Int. Cl. H01l 3/00
U.S. Cl. 148—33.3 9 Claims

ABSTRACT OF THE DISCLOSURE

Surface areas and exposed P-N junctions of bodies of semiconductor material are initially etched and then cleaned with (1) ethylenediaminetetraacedic acids or (2) with a solution of iodine or (3) a solution of iodine and iodine pentoxide to obtain an essentially atomically clean surface prior to passivation; the treated surfaces are passivated and primed by a silane composition which is a primer for an overlay of a protective coating material subsequently applied to the passivated surface. The protective coating consists of a material selected from the group consisting of room temperature vulcanizing rubbers, silicone varnishes, solid perfluorohydrocarbons, parylene resins, cured resinous aromatic polyimide, cured resinous aromatic polyamide-imide, and cured resinous benzimidazole-imide copolymer.

BACKGROUND OF THE INVENTION

(1) Field of the invention

The present invention relates to materials and processes for cleaning, passivating and protecting surface areas of bodies of semiconductor material including P-N junctions exposed thereat.

(2) Description of the prior art

In the operation of semiconductor devices degradation of performance frequently occurs due to surface phenomena such as the presence of leakage paths on, or near, the surface of a body of semiconductor material forming the device.

In order to prevent the deleterious effects of moisture and other reactive constituents of the atmosphere of the electrical characteristics of silicon semiconductor devices, the silicon surfaces of the devices are etched, sometimes this is followed by a passivation treatment, and then the surfaces are provided with one or more layers of a protective coating material. However, if the surfaces of the devices are not clean enough before passivation and/or application of the protective coating, the devices often may be unstable electrically, particularly at elevated temperatures, in excess of 120° C., and at voltages in excess of 1000 volts.

A recent improvement resides in a pretreatment of the etched surface before the protective coatings are applied to the semiconductor surface. As set forth in U.S. Pat. 3,447,975 on the surface of a silicon semiconductor there is produced a monolayer of a reaction product of a halogenated organic silane with hydroxyl ions present in the lattice sites on the surface of the body of semiconductor material and silicon atoms at the surface of the semiconductor material. This monolayer provides a passivated surface layer of essentially monatomic thickness. An essentially water impervious protective coating material is then disposed over this monolayer. Although this protective coating affords protection to the monolayer, the monolayer, being only essentially one molecule in thickness, is easily damaged if not handled carefully and properly, and the desired adequate and reliable full protection of the surface of the semiconductor element is not achieved. One additional factor is that this process did not achieve a sufficiently clean surface on the silicon of the device prior to the passivation step, and consequently the electrical characteristics while improved over earlier practices, were still below expectations in that some failures at high voltages were experienced.

An object of this invention is to provide and maintain an atomically clean surface on bodies of semiconductor material included at the P-N junctions.

Another object of this invention is to provide a layer of a cross-linked silicone polymer bonded to an essentially atomically cleaned surface of a body of semiconductor material including P-J junctions thereof, the polymer having a unit structure such as:

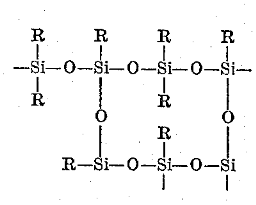

where R is at least one radical selected from the group consisting of monovalent alkyl, aryl, alkyl iodide, and aryl iodide radicals, wherein one iodine atom is substituted on the alkyl and aryl radicals respectively of the latter group.

Another object of this invention is to provide a protective resinous overcoating for a layer of cross-linked silicone polymer applied to an atomically clean silicon surface.

Another object of this invention is to provide a method for etching and cleaning, passivating, and overcoating with a resinous material the passivated surfaces of exposed P-N junctions in a body of semiconductor material.

A further object of this invention is to provide a method for temporarily passivating surfaces of exposed P-N junctions and removing the temporary passivation and replacing it with a permanent passivated surface.

Other objects of this invention will in part, be obvious and will, in part, appear hereinafter.

SUMMARY OF THE INVENTION

In accordance with the teachings of this invention there is provided a semiconductor element comprising a body of silicon semiconductor material and particularly a body having at least two regions of opposite type semiconductively and a P-N junction between each pair of regions of opposite type semiconductivity and at least one of the P-N junctions exposed at a surface of the body, and a layer of a cross-linked silicone polymer bonded to the surface of the body whereat at least one P-N junction is exposed and having a repeating unit:

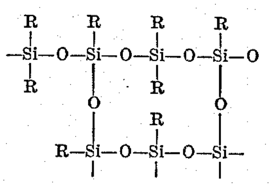

wherein R is at least one radical selected from the group consisting of an alkyl, an aryl, an alkyl iodide, and an aryl iodide.

DESCRIPTION OF THE INVENTION

Figure 1:
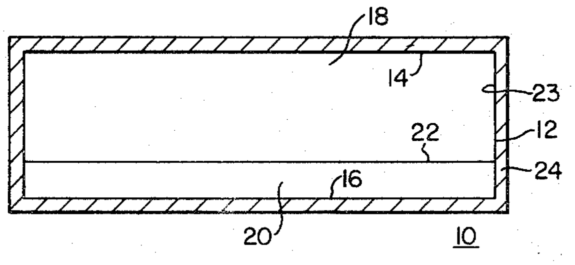
FIGS. 1, 2 and 3 are views in cross-section of a body of semiconductor material being processed in accordance with the teachings of this invention.
Figure 2:
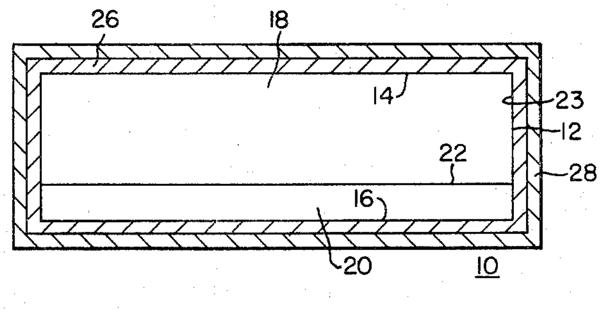

With reference to FIG. 1, there is shown a semiconductor element 10 comprised of a body 12 of semiconductor material. The body 12 has two major opposed surfaces 14 and 16. The body 12 is comprised of a suitable semiconductor material such, for example, as silicon, silicon carbide, germanium, compounds of Group III and Group V elements and compounds of Group II and Group VI elements.

In order to more fully describe the invention, and for no other purpose, the body 12 will be described as a body comprised of silicon semiconductor material having two regions 18 and 20 of opposite type semiconductivity and a P-N junction 22 disposed therebetween and exposed at a surface 23 of the body 12.

During the fabrication of semiconductor elements it is desirable to retain an atomically clean surface for all exposed surfaces of the elements during processing and to be able to check the electrical characteristics of the elements as a means of controlling the manufacturing process. A passivated surface is preferred to prevent deterioration of the electrical characteristics of the elements from occurring when unprotected surfaces of the bodies of semiconductor materials are exposed to the ambient for any length of time. However, it is desirable that the passivated surface be only temporary and be capable of removal at a later stage in the manufacturing process. Solutions of iodine alone or iodine pentoxide and iodine are found to be suitable materials for providing temporary passivation of exposed surfaces and exposed portions of P-N junctions and to provide, and to maintain, atomically clean exposed surfaces of elements during processing of the elements.

A temporary layer 24 of a passivating material which also provides an atomically clean surface 23 is formed on at least the surface 23 of the body 12 whereat the P-N junction 22 is exposed. Prior to the formation of this temporary passivation layer 24 the junction surface is etched with any conventional acid or alkali etchant. In order to achieve the optimum use of the process of this invention no insoluble chemical deposits should be formed on the silicon surface. A suitable etchant is a solution consisting of one part by volume nitric acid to one part by volume hydrofluoric acid to one part by volume of acetic acid.

After the desired period of etching of the junction surface 23 of the body 12 has been completed, and while the etching action is still in progress, the body 12 is removed from the etching solution and exposed surface 23 is cleaned and a temporary passivated surface is provided by quenching the body 12 in a saturated solution of pure iodine in an anhydrous solvent such, for example, as acetone, carbon tetrachloride, chloroform, isopropyl alcohol, or methanol. A preferred solvent is methanol because of its low cost and the least amount of safety precautions which are required. The iodine-methanol solution contains from 10 to 20 grams of iodine in each 100 milliliters of methanol.

The excess iodine is rinsed from the semiconductor element 10 by a fresh iodine solution to remove any remaining acid from the etching solution which would form a contaminated iodine film. The element 10 is rinsed well with acetone to remove excess iodine thereby leaving a tightly bound chemisorbed iodine on the atomically clean surface 23 of the body 12. This tightly bound chemisorbed iodine forms the temporary passivation layer 24, which in essentially a monatomic layer, with iodine atoms joined to silicon atoms of all exposed surfaces on which the layer 24 is formed.

The iodine prevents the formation of oxides on the treated surfaces as well as displacing the hydroxides and the fluorides resulting from the etching process. The displacement of the fluorides in the result of the formation of interhalogen compounds, particularly $IF_5$ and $IF_7$. Since the fluorides and metal ion complexes present on the surface 23 after etching are absorbates which are detrimental to the stability of the electrical properties of the surface 23, the removal of these adsorbates produces an ideal surface for passivation.

An alternate method of obtaining an atomically clean surface 23 and for forming the temporary passivation layer 24 thereon is to quench the body 12 in a solution of iodine and iodine pentoxide after etching at least the exposed surface 23 whereat exposed portions of P-N junction 22 are formed has been completed and while the etching action is still in progress. The solution consists of from 10 to 20 grams of iodine and from 0.2 to 5 grams of iodine pentoxide in 100 milliliters of methanol. The excess iodine and iodine pentoxide is removed by one or more rinses of acetone. The cleaning of the surface 23 and the temporary passivation of the exposed surfaces of the body 12 is achieved by iodine atoms displacing impurities on the surface 23 and being joined to the silicon atom of the exposed surfaces of the body 12. The layer 24 is essentially a monatomic layer of iodine and iodine pentoxide bonded to silicon atoms of the exposed surfaces of the body 12 upon which the layer 24 is formed.

Another alternate method of processing the body 12 to clean the surface 23 and to form the temporary passivation layers 24 is to rinse the body 12 in the iodine solution after etching of the exposed P-N junction 22 followed by rinsing the body 12 in a solution of iodine and iodine pentoxide, the composition of the solution being the same as described heretofore and at least once with the acetone to form the monatomic layer 24 of iodine and iodine pentoxide bonded to silicon atoms of the exposed surfaces of the body 12 upon which the layer 24 is formed.

Upon completion of the cleaning of the surface 23 and the formation of the temporary passivation layer 24, the element 10 is ready for testing to evaluate the electrical properties of the element 10. Electrical testing determines which elements need reworking and scrapping and which elements are suitable for further processing.

Upon completion of electrical testing, the body 12 is disposed in preferably a hot mixed silane solution. The hot solution consists of two or more halogenated silanes in a non-reactive solvent. The silane comprises at least 5 mol percent of at least one trifunctional silane having only a single organic radical attached to the silicon atom, the other three bonds on silicon being attached to halogen which is readily removed so that the silane can enter into cross-linking reactors. Thus monomethylsilane, monophenylsilane, monotolylsilane and monobutylsilane, and mixtures of two or more of such silanes can be employed. The balance preferably comprises diorganic substituted silanes, with only a small proportion, if any, of a triorganic silane such as trimethylsilane or triphenylsilane. The remaining valences on silicon are satisfied by halogen atoms such as chlorine or bromine. An example of a suitable halogenated silane mixture is 10 mol percent diphenyldichlorosilane, 24 mol percent monomethyltrichlorosilane, 65 mol percent dimethyldichlorosilane and 1 mol percent trimethylmonochlorosilane. Examples of suitable solvents are p-cymene, n-decane, and xylene and mixtures thereof. The body 12 with its temporary passivated layer 24 is treated in the solution at a temperature of from 90° C. to 130° C. for at least thirty minutes. The treated body 12 is then removed from the solution and rinsed in acetone and baked in a vacuum chamber. The chamber is heated and is employed to cure the material to form the passivated surface, and to drive-off any residual moisture and other contaminants from the body 12.

A preferred solution consists of from 50 to 100 parts by volume of diphenyldichlorosilane and from 25 to 50 parts by volume of monomethyltrichlorosilane in 1000 parts by volume of the non-reactive solvent xylene heated to a temperature of from 110° C. to 115° C. The treated body 12 remains in the solution for a period of from one-half hour to one hour. The element 10 is then rinsed at least once in acetone, drip dried and baked in a vacuum of less than $10^{-3}$ torr for approximately one hour at 180° C.±5° C. Upon completion of the mixed silane treatment and the baking step, the temporary passivation layer 24 has been converted on the surface 23 to a layer 26 of a material chemically bonded to the exposed surfaces of the body 12 forms a permanent passivated surface.

The structure of the layer 26 of a semiconductor element which has been rinsed only in a saturated iodine solution is not entirely known or understood. It is found, however, that the mixed silane solution cleanses the exposed surfaces of the body 12 upon which the layer 26 is formed of all iodine and the layer 26 in a cross-linked silicone polymer chemically bonded to the silicon atoms of the treated exposed surfaces. The iodine of the temporary passivated surface layer 24 is present in the layer 26 but in what structural arrangement it is not known.

A semiconductor element which has been rinsed in a solution consisting of iodine and iodine pentoxide, upon being processed by a mixed silane solution of diphenyldichlorosilane and monomethyltrichlorosilane in xylene described heretofore, has the following chemical reaction taken place on the treated exposed surfaces between the diphenyldichlorosilane and the iodine and iodine pentoxide.

$$R_2SiCl_2+\tfrac{4}{5}I_2+\tfrac{1}{5}I_2O_5 \rightarrow R'_2SiCl_2+H_2O$$

$$nR'_2SiCl_2 + 2nH_2O \longrightarrow 2nHCl + \left[ HO-\underset{R'}{\overset{R'}{Si}}-OH \right]_n \longrightarrow \left[ O-\underset{R'}{\overset{R'}{Si}}-O \right]_n + nH_2O$$

wherein $R=C_6H_5$ and $R'_2=C_6H_4I$.

It is to be noted that the result of the above chemical reactions is that the net $H_2O$ of the chemical reaction is zero. This is different from the chemical reactions which occur further away from the treated exposed surfaces of the body 12 wherein iodine apparently takes no part in the reaction as it is not available and R′ is replaced by the organic radical $C_6H_5$. The diiodophenyldichlorosilane $(C_6H_4I)_2SiCl_2$ forms a mixed silicone at the same time of the reaction of the mixed silanes with the available hydroxyl radicals absorbed physically on the iodine treated surface. The monomethyltrichlorosilane appears to be the material which provides the cross-linking.

The inorganic portion of the layer 26 is predominantly bonded to the silicon atoms of the surface 23 and the organic portion is oriented away from the surface 23 whereby it acts as a suitable primer for a protective coating material. It is to be noted that the Si-O bonds are formed on the iodine protected clean silicon surface without the need of a separate cleaning process to remove the iodine. The silicon surface 23 therefore remains clean throughout the entire passivation process.

An alternate method of treating a semiconductor element which has been rinsed only in a saturated solution of iodine is to first rinse the element in a solution of iodine and iodine pentoxide. The composition of the solution is as described heretofore. This rinse converts the temporary passivation layer 24 from just iodine bonded to silicon atoms of the surface 23 to a mixture of iodine and iodine pentoxide bonded to the silicon atoms of the surface 23. The element is then treated in the mixed silane solution as previously described which results in the same structure for the layer 26.

It has also been found that an element which has been treated with a saturated solution of iodine, or has been treated in a solution of iodine and iodine pentoxide, or has been treated with a saturated solution of iodine followed by a rinse in a solution of iodine and iodine pentoxide may also be treated in a heated solution of a halogenated silane and a suitable nonreactive solvent. Suitable halogenated silanes are diphenyldichlorosilane, methyldichlorosilane, dimethyldichlorosilane, and trimethylchlorosilane. Suitable solvents are p-cymene, n-decane, and xylene, with xylene being preferred. A preferred solution consists of from ½% to 3% by volume of diphenyldichlorosilane in xylene heated to a temperature of from 90° C. to 130° C.

When treated in the solution described heretofore and baked in a vacuum, the iodine or the iodine and iodine pentoxide of the layer 24 of the body 12 react with the halogenated organic silane to form a layer of a linear silicone polymer bonded to the silicon atoms of the surface of an element when it is made of silicon semiconductor material. The linear silicon bonded to the silicon atoms of the surface appears to be essentially only a molecule in thickness and apparently is not cross-linked. The entire exposed surface of the element may not be covered by the linear silicone polymer. The structure of the linear silicone polymer appears to be:

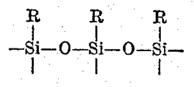

wherein R is at least one radical selected from the group consisting of monovalent alkyl, aryl, alkyl iodide, and aryl iodide.

Either of the silane treatments, the heated solution of a halogenated silane and a non-reactive solvent, or the heated solution of a mixed silane and a non-reactive solvent also forms a permanent passivated surface on the body 12 without the intermediate iodine or iodine-iodine pentoxide processing. A passivated surface produced by the mixed silane solution is preferred because it produces a stable cross-linked silicone polymer having a three dimensional network bonded to the surface 23 of the body 12 illustrated as follows:

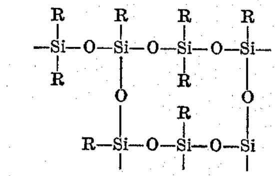

where R is at least one radical selected from the group consisting of an alkyl, an aryl, and alkyl iodide and an aryl iodide.

A passivated surface of the body 12 produced by utilizing only a heated solution of halogenated silane and a nonreactive solvent produces a linear silicone polymer bonded to the surface 23 which is only essentially a molecule in thickness and has a structure as shown heretofore.

If only a single or a mixed silane treatment is employed without any form of iodine the cleaning and passivating of the surface 23 is preferably accomplished in one continuous process. After polishing and lapping to parallelism the two surfaces 14 and 16 of the body 12, the surface 23 are cleaned by rinsing in a solution containing an ethylenediaminetetraacetic acid or a salt of an ethylenediaminetetraacetic acid. A treatment in a solution of one of the acids or a salt of one of the acids immobilizes the reactive sites present on the exposed surface of the element and the P-N junction exposed thereat. The treatment in the solution also provides an atomically clean surface 23 on the body 12 upon which a permanent passivated surface may be formed by either of the previously described silane treatments. A preferred material of which a solution may be formed is the ammonia salt of ethylendiaminetetra-acetic acid, $(HN_3)4EDTA$, or the ethylenediaminetetra-acetic acid salt dissolved in a basic medium. A preferred cleaning process embodies the cleaning of the exposed surface 23 of the body 12 in a hot solution of 0.1 M $(NH_3)4EDTA$, followed by rinsing in hot distilled water and acetone. The body 12 is then immediately immersed in the preselected silane solution and baked in a vacuum to form the desired silicone polymer layer 26 bonded to the surface 23.

A layer 28 of a protective coating material is disposed on the layer 26 of passivating material. The coating 28 is applied by any one of the means known to those skilled in the art such, for example, as painting, spraying, dipping, and the like.

The material comprising the coating 28 is essentially water impervious and has good electrical insulating properties. The material should also be flexible enough to endure thermal cycling of the body 12 without fracturing the layer 28 or separating the layer 28 from the layer 26.

Room temperature vulcanizing rubbers, solid perfluorohydrocarbons, such, for example, as polytetrafluoroethylene and trifluoromonochloroethylene, cured solid, infusible and insoluble aromatic polyimides cured, solid, infusible and insoluble aromatic polyamide-polyimides, and a cured, fused, insoluble copolymer consisting of both imide and benzimidazole linkages are examples of suitable materials for the coating 26.

A suitable room temperature vulcanizing rubber consists of a copolymer of dimethylpolysiloxane and methyl hydrogen polysiloxane. A catalyst, is mixed with the copolymer of dimethylpolysiloxane and methyl hydrogen polysiloxane in order to produce a room temperature vulcanizing silicone rubber which will cure in approximately 24 hours.

polyimides are taught in the three aforementioned U.S. patents.

A suitable resinous aromatic amide-modified polyimide material for the layer 28 has the repeating unit:

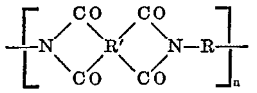

in which $n$ is an integer of at least 5 and R represents a divalent radical selected from the group consisting of:

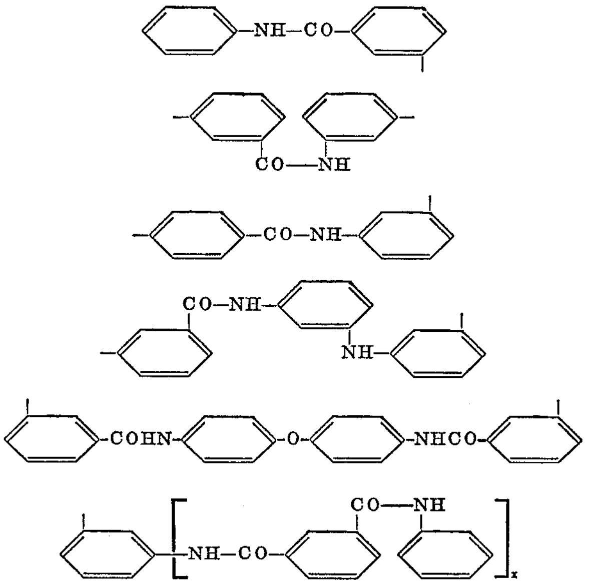

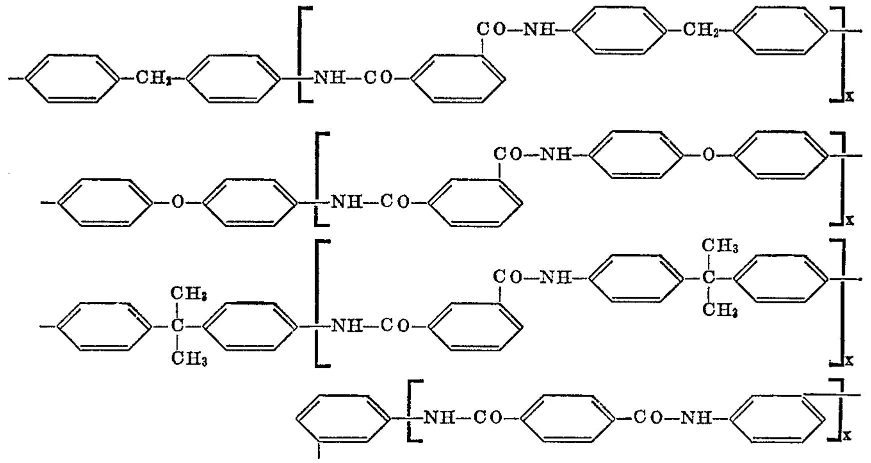

in which $x$ is an integer of from 1 to about 500, and in which R′ represents a tetravalent radical selected from the group consisting of:

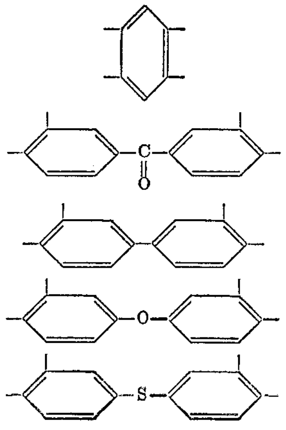

Preferably the material of the layer 28 is a high temperature coating material and is selected from the group consisting of polyimides and polyamides-polyimide.

The preferred material of the layer 28 is preferably applied to the preselected passivated surface area of the treated body 12 with the applied material in solution form is then heated to convert the resinous soluble polymer intermediate to a cured, solid, infusible and insoluble polyimide or a polyamide-polyimide polymer.

Preferably the solution form is prepared by disposing a soluble precursor of an aromatic polyimide or an aromatic polyamide-polyimide in a suitable solvent such, for example, as dimethylacetamide and N-methyl pyrollidone. Further details on the preparation and cure of aromatic polyimides may be found in the teachings of U.S. Pats. 3,179,614 and 3,179,634. Details and the preparation of some of the aromatic polyamide-polyimides are taught in U.S. Pat. 3,179,635. Further details of suitable solvents for both aromatic polyimides and aromatic polyamide-

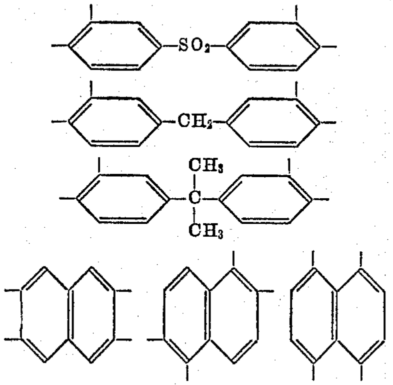

Another suitable resinous amide-modified polyimide for the material of layer 28 is one having the repeating unit

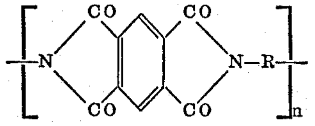

in which *n* is an integer of at least 5 and R represents a divalent radical selected from the group consisting of:

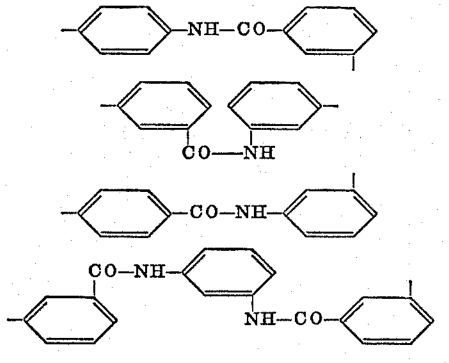

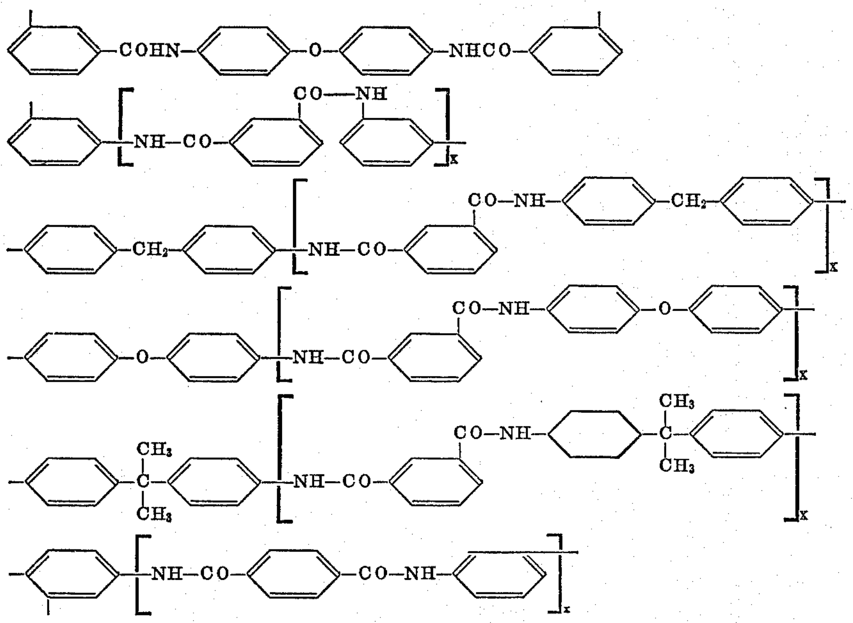

in which *x* is an integer of from 1 to about 500 and another suitable amide-modified polyimide when cured has the repeating unit:

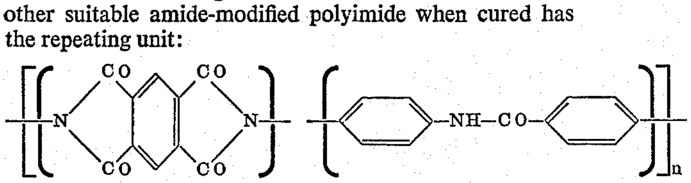

wherein *n* is an integer of at least 5.

Other suitable resinous aromatic amide-imide polymers suitable for the material of the layer 28 contain the repeating unit:

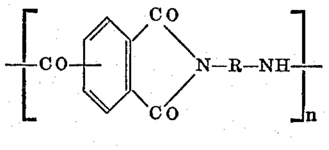

where *n* is an integer of about 50 to 15,000 and R is a divalent organic radical composed only of H, C, N, S, and O, for example only divalent radical selected from the group consisting of:

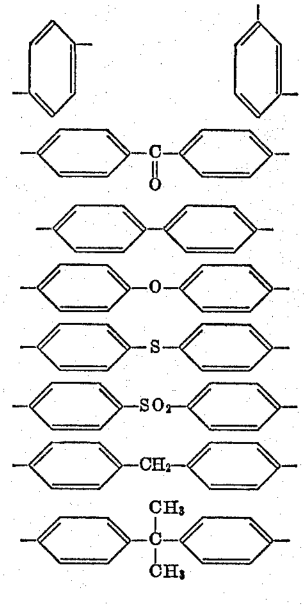

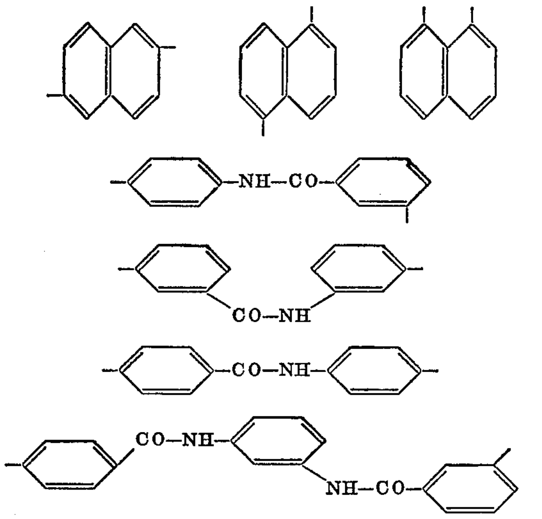

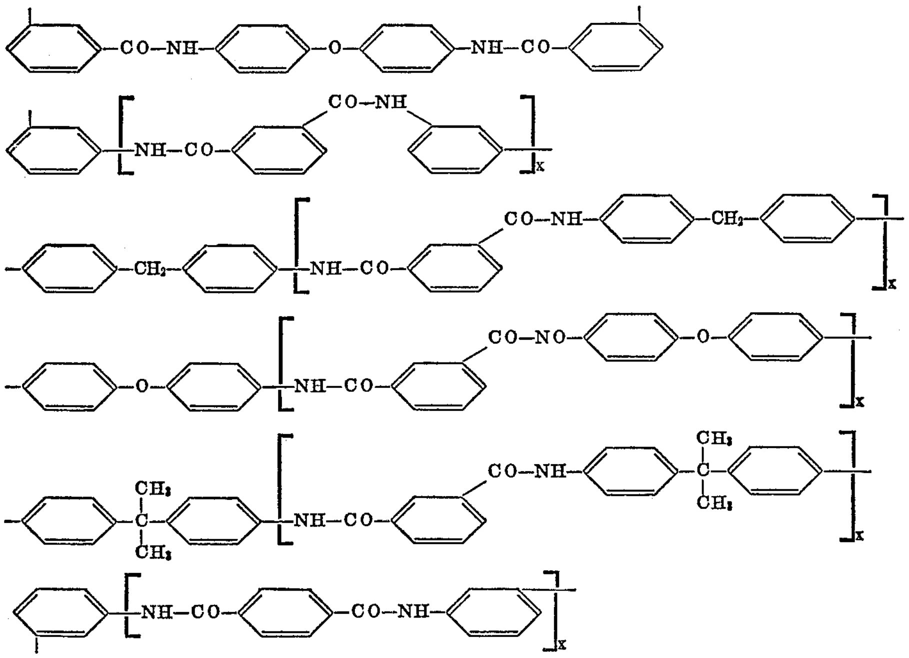

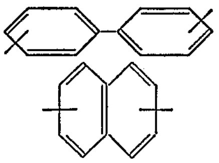

and

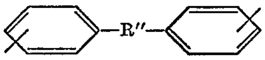

wherein R″ is selected from the group consisting of an alkylene chain having from 1 to 3 carbon atoms, —O—, —S—, —SO₂—, —N(R‴)—, —Si(R‴)(R‴)—, —O—Si(R‴)(R⁗)—O—, —O—P(R)(=O)—O— and —P(R‴)(=O)— in which X is an integer of from 1 to about 500. Copolymers containing two or more of the radicals are also suitable for the material of layer 28.

Suitable resinous polyimides which may be used to form the layer 28 have the recurring unit:

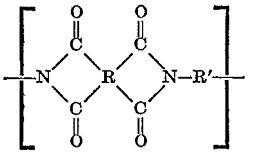

where R is a tetravalent radical containing at least one ring of six carbon atoms, the ring being characterized by benzenoid unsaturation, the four carbonyl groups being attached directly to separate carbonyl atoms in a 6 membered benzenoid ring of the R radical and each pair of carbonyl groups being attached to adjacent carbon atoms in a ring of R radical; and wherein R′ is a divalent radical selected from the group consisting of:

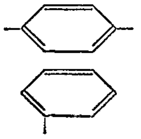

wherein R‴ and R⁗ are selected from the group consisting of alkyl and aryl.

The polyimides and polyamide-imides referenced heretofore form a film for the layer 28 which has high tensile properties, desirable electrical properties, stability to heat and water, and good adherence to the layer 26.

Although the layer 24 of passivating material and the protective coating layer 26 need only be applied to the exposed end surfaces of the P-N junctions and the contiguous surfaces of the body of semiconductor material it is preferred that the entire exposed surface area of the body have the layers 26 and 28 disposed upon it.

The thickness of the layer 28 is determined by the voltage and current rating of the body 12 of semiconductor material. It is desirable, however, that the layer 28 be a minimum of approximately 1 mil in thickness. For a 1500 volt thyristor a thickness of about 6 mils is satisfactory.

It is desirable that the layer 28 be formed by curing the applied material in a continuous series of heating steps involving increments of increasing temperature. This is practiced to prevent blistering of the layer 28 which may occur by the entrapment of water vapor or alcohol, one or the other being a reaction product formed by the curing of the polyimide and polyamide-polyimide materials. A proferred heating cycle to cure the applied material is as follows: place the coated semiconductor element in an air circulating furnace and heat at 100° C. for 1 hour minimum; then raise the furnace temperature to 150° C. and continue heating for an additional ½ hour minimum; then raise the furnace temperature to 200° C. and continue heating for an additional ½ hour minimum; and finally raise the furnace temperature to the recommended maximum curing temperature for the particular material of the coating layer 24 and continue heating for a period sufficient to complete the polymerization of the material. In practice the total curing time is from two to three hours.

The cured material of the layer 28 forms a film which is adherent to the surface of the layer 26 and is resistant to abrasion and scratching.

It has been found that where the cured material of the layer 28 has a repeating unit:

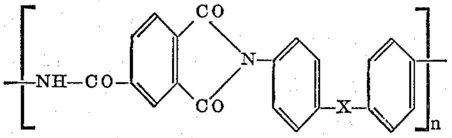

where X is a radical selected from the group consisting of —$CH_2$— and —O—, and $n$ is an integer of from 10 to 100, the final furnace temperature is approximately 300° C. and preferably from 250° C. to 280° C. The film is tough, flexible and has good thermal stability permitting the element 10 to operate at a junction temperature in excess of 200° C.

A cured, fused, insoluble copolymer consisting of both imide and benzimidazole linkages prepared from soluble polymeric precursors or intermediate by heating or by a chemical curing process is also suitable for making the coating 28. Upon curing the benzimidazole-imide copolymer has at least one benzimidazolyl group and consists essentially of the recurring unit:

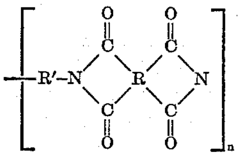

wherein $n$ has a value of from about 10 to about 200,000.

R is at least one tetravalent organic radical in which the four bonds are so arranged that the imide rings contain either five or six members. The five or six members of the imide rings are selected from the group consisting of:

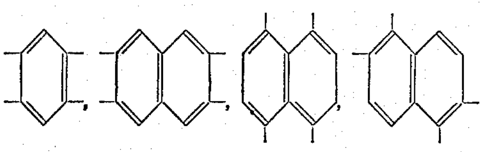

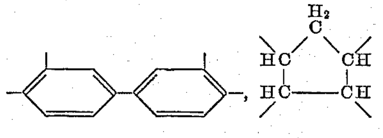

and

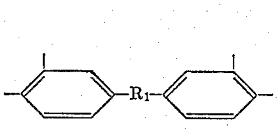

$R_1$ in the recurring unit is a divalent radical selected from the group consisting of aliphatic hydrocarbon radicals having from one to four carbon atoms and the alkyl and aryl substituted silane and siloxane radicals and oxy, carbonyl, sulfonyl, sulfide, amide, benzimidazolyl, keto, benzoxazolyl and ester radicals.

R′ is a divalent organic radical containing one or more benzimidazole groups selected from the group consisting of:

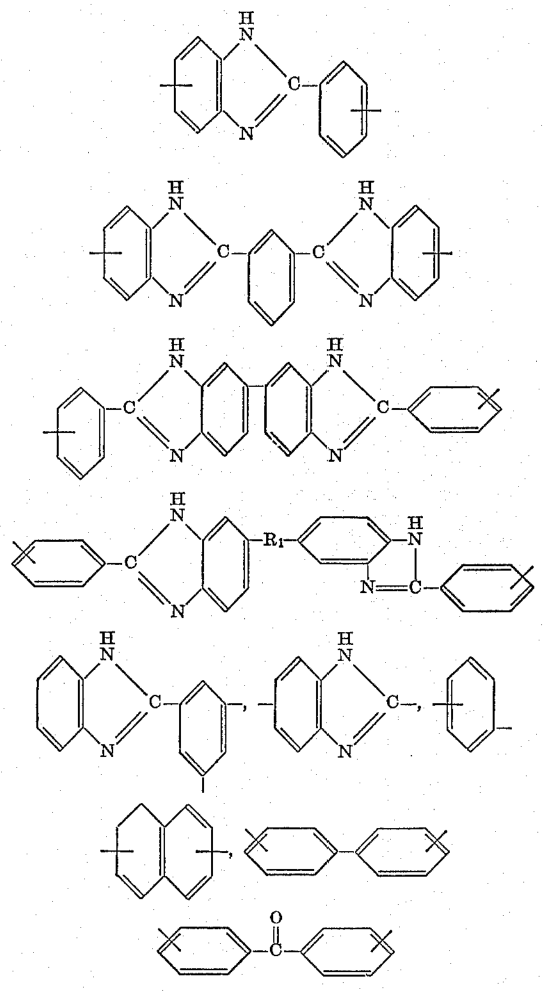

and

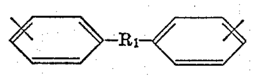

A soluble resinous polymeric intermediate from which the cured, fused, insoluble copolymer may be prepared comprises the condensation product of at least one aromatic primary amine, a triaminobenzanilide, and a dianhydride. Suitable aromatic primary amines are:

5,4′-diamino-2-phenylbenzimidazole
5,3′-diamino-2-phenylbenzimidazole
2,2′-(m-phenylene)-bis (5-aminobenzimidazole)
2-(3′,5′-diaminophenyl) benzimidazole
bi 5-[2-(m-aminophenyl) benzimidazolyl]
5,5′-oxybis [2-(p-aminophenyl) benzimidazole]
2,2′-(2,6-naphthylene)-bis-(5-aminobenzimidazole)
2,6-bis (4-aminophenyl) benzo [1.2.4.5] bisimidazole
2,7-bis (3-aminophenyl) naphtho [2.3.6.7] bisimidazole.

Suitable dianhydrides are the pyromellitic dianhydrides.

3,3′,4,4′-benzophenonetetracarboxylic dianhydride
3,3′,4,4′-biphenyltetracarboxylic dianhydride
bis(3,4-dicarboxyphenyl) ether dianhydride
bis(3,4-dicarboxyphenyl) sulfide dianhydride
bis(3,4-dicarboxyphenyl) sulfone dianhydride
bis(3,4-dicarboxyphenyl) methane dianhydride
2,2-bis(3,4-dicarboxyphenyl) propane dianhydride
2,3,6,7-naphthalenetetracarboxylic dianhydride
1,2,5,6-naphthalenetetracarboxylic dianhydride and
1,4,5,8-naphthalenetetracarboxylic dianhydride.

If desired layer 28 may include a filler material, preferably an electrically insulating material having the same dielectric constant as, or less than that of the protective coating. The filler is uniformly distributed throughout the polyimide, polyamide-polyimide and the benzimidazole-imide copolymer materials of the layer 28. Suitable electrically insulating materials, in finely divided or pulverized form, which can be used as a filler material are aluminum oxide, silicon oxide, glass fibers, boron nitride, quartz, mica, magnesium oxide and reactivated polytetrafluoroethylene.

The electrically insulating filler material preferably should not exceed 64 percent, by volume, of the layer 28. A preferred range of from 40 percent to 50 percent by volume is desirable as this mixture of filler material and the protective coating material, has the best working consistency.

With either a filled or unfilled polyimide, polyimide-polyamide, or a benzimidazole-imide copolymer material, the electrical properties of the element 10 is improved and the element's functional operating temperature range increased to a range extending from approximately −100° C. to approximately 200° C. Additionally, the hardness, the abrasion and scratch resistance, the adhesive capability, and the thermal stability of the material of the layer 28 makes it a suitable material as a protective coating layer for an electrically insulating film such, for example, as silicon oxide or silicon nitride films employed to passivate selected surface areas of semiconductor devices.

Figure 3:
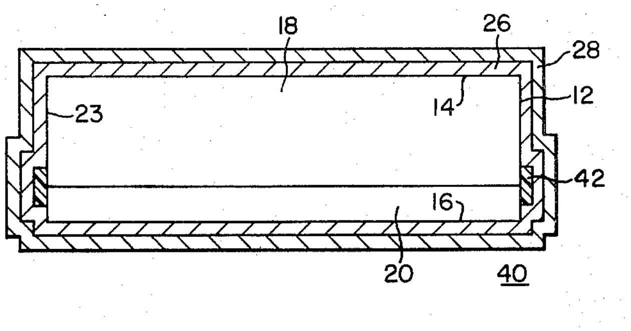

Referring now to FIG. 3 there is shown a semiconductor element 40 which is an alternate embodiment of the element 10. The only difference between the elements 10 and 40 is a layer 42 of electrically insulating material disposed on at least the exposed end portions of the P-N junction 22 to minimize reverse current leakage across the exposed end portions. The material of the layer 42 is at least one selected from the group consisting of silicon oxide, silicon nitride, silicon oxide-silicon nitride, aluminum oxide, and aluminum nitride. Preferably the layer 26 of passivating material is disposed on at least the layer 42 and is bonded to the layer 42 in the same manner as it is bonded to the surface 23. However, it is not necessary that layer 26 be applied to the element 40 at all prior to the formation of the layer 42 thereon. The layer 28 of either a filled or an unfilled aromatic polyamide, an aromatic polyamide-polyimide or a benzimidazole-imide copolymer material is disposed on the layer 24. Other suitable materials for comprising the layer 28 are solid polytetrafluoroethylene and a parylene such, for example as, poly-p-xylene, monochloro-p-xylylene, dichloro-p-xylylene, ethyl-p-xylylene, methyl-p-xylylene, cyano-p-xylylene, and bromo-p-xylylene.

An alternate method of making the element 40 is to place the iodine coated body 12 in a furnace for growing the material of the layer 42 on the body 12. The body 12 is brought up to the temperature for the deposition of the layer 42. However, before the growth of the layer 42 is initiated, a hydrogen gas stream is caused to flow over and about the surfaces of the body 12. The iodine is quickly removed by mass reaction with the hydrogen gas. This process is more advantageous than vacuum sublimation of the iodine as the resulting surface contamination of the body in the hydrogen process is less than that obtained employing the vacuum sublimation process. The material growth process of the layer 42 is then practiced followed by a process employing photolithographical techniques and selective etching to obtain the desired structure for the layer 42.

Figure 4:
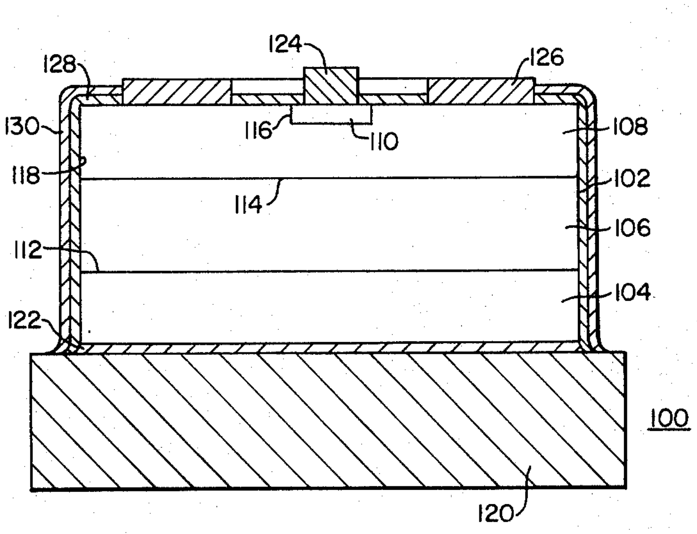
FIG. 4 is a fusion assembly in cross-section, made in accordance with the teachings of the invention.

With reference to FIG. 4, there is shown a semiconductor fusion assembly 100 comprised of a body 102 of semiconductor materials, regions 104, 106, 108 and 110 of alternate type semiconductivity, and P-N junctions 112, 114 and 116 disposed between respective regions 104 and 106, 106 and 108, and 108 and 110 of alternate type semiconductivity. Portions of the P-N junctions 112, 114 and 116 are exposed in surface 118 of the body 102.

A thermally and electrically conductive support member 120 consisting of a material selected from the group consisting of molybdenum, tungsten, tantalum, and base alloys thereof is affixed to the body 102 by a layer 122 of electrical solder. A first electrical contact 124 is affixed to the region 110 and a second electrical contact 126 is affixed to the region 108. A layer 128 of passivation material is disposed on the surface 118 in accordance with the iodine-mixed silane treatment described heretofore. A layer 130 of protective coating material is disposed on the layer 128.

Often traces of metal ions still remain on the surface 118 in the layer 128 on the surface of the layer 128, or in two or more of the locations of the fusion assembly 100 even after surface cleaning and passivating processes. Sequestering agents, such, for example, as alizarin may be added to the solution of a polymeric intermediate or an aromatic polyimide or an aromatic polyamide-polyimide before applying the solution to the layer 128. The sequestering agent, by chelation, renders the metal ions inert. Alizarin is added to the solution in the quantity of up to 1% by weight. One half percent by weight of alizarin in the solution has been found to work well for semiconductor devices having high voltage-low reverse current properties, where the magnitude of the current is measured in microamperes and nanoamperes. In plotting the reverse voltage curves for these devices, the "knee" of the curve is very sharp compared to the "soft knee" of the curve exhibited by devices in which the polyimide or polyamide-polyimide coating does not contain the alizarin. The curing cycle for this modified solution is the same as for the unmodified solution.

Semiconductor elements comprising gallium arsenide semiconductor material and cleaned and passivated in accordance with the teachings of this invention also exhibit excellent desirable surface electrical characteristics.

The following examples are illustrative of the teachings of this invention:

EXAMPLE I

Fourteen N-P-N-P thyristor semiconductor fusion assemblies were made and tested electrically. The configuration of the elements is the same as shown in FIG. 4. The body 102 was N-type silicon, the regions 104 and 108 were of P-type semiconductivity, and the region 110 was N-type semiconductivity formed by alloying the contact 124 to the body 102. The contact 124 was made of gold-antimony. The contact 126 consisted of goldboron. The support member 120 was of molybdenum and the layer 116 consisted of aluminum solder.

Seven of the assemblies were treated by a prior art method of treating the etched bodies 102 in a solution of diphenyldichlorosilane and xylene heated to a temperature of 110° C.±5° C. for ½ hour.

The remainder of the assemblies were treated in accordance with the teachings of this invention employing a solution consisting of iodine and iodine pentoxide followed by a mixed silane treatment, the compositions being the same as described previously in the specification.

All the assemblies were then dried in a vacuum of less than $10^{-3}$ torr for one hour at 185° C.±5° C.

The assemblies were tested electrically at 130° C. and the results are tabulated in Table I.

A room temperature vulcanizing rubber consisting of a copolymer of dimethylpolysiloxane and methyl hydrogen polysiloxane with a catalyst, lead octoate, mixed therein was disposed on the passivated surfaces produced by the different silane treatments. The room temperature vulcanizing silicone rubber was cured for 24 hours. The assemblies were tested electrically at a temperature of 130° C. and the results are tabulated in Table I.

TABLE I

[Gate current in milliamps at 130° C.]

| Unit number | Prior art (No iodide cleaning) After silane treatment | After RTV coating | New process (iodide treated) After mixed silane treatment | After RTV coating |
|---|---|---|---|---|
| 1 | 118 | 192 | 150 | 146 |
| 2 | 120 | 192 | 117 | 118 |
| 3 | 149 | 203 | 150 | 152 |
| 4 | 75 | 158 | 120 | 116 |
| 5 | 88 | 122 | 94 | 94 |
| 6 | 132 | 220 | 140 | 136 |
| 7 | 171 | 192 | 174 | 176 |

The prior art semiconductor fusion assemblies showed that they had unstable surface conditions. The fusion assemblies processed in accordance with the teachings of this invention exhibited a stable surface condition.

EXAMPLE II

A semiconductor element was made in accordance with the teachings of this invention and had the configuration as shown in FIG. 4.

A body 102 of N-type silicon having a circular configuration was doped with a P-type impurity to produce regions 104 and 108 of P-type semiconductivity. The remaining N-type semiconductivity material of the body 102 formed the region 106. P-N junctions 112 and 114 were disposed between the respective regions 104 and 106 and 106 and 108. The P-N junction 112 and 114 had exposed end portions in the side surface 118 of the body 102.

A thermally and electrically conductive circular support member 120 consisting of molybdenum was joined to the region 104 of the body 102 by a layer 122 of aluminum solder alloy.

A first electrical contact 124, circular in shape, consisting of gold-antimony was disposed centrally on the top surface of and joined to the region 108 by an alloying process. Upon melting and recrystallization the region 110 of N-type semiconductivity was formed with the P-N junction 116 disposed between regions 108 and 110.

A second electrical contact 126, annular in shape, and consisting of a gold-boron alloy was disposed on the top surface of the region 108 about the contact 124 and joined to the region 108 in a non-rectifying electrical conductive relationship.

The partially completed fusion assembly was spin etched with a solution of one part by volume nitric acid, one part by volume hydrofluric acid, and one part by volume acetic acid to particularly etch away the damaged surface areas of the body 102. The spin etching in the solution was continued from 13 to 17 seconds at room temperature. The partially completed fusion assembly was then quenched in a solution of pure iodine in methanol, the solution containing 15 grams of iodine in each 100 ml. of methanol.

The surfaces of the body 102 were then rinsed with a solution consisting of 15 grams of $I_2$ and 0.2 gram of $I_2O_5$ in each 100 ml. of methanol to provide a coating of $I_2$ and $I_2O_5$ on the exposed surfaces of the body 102. Any excess $I_2$ and $I_2O_5$ was removed by rinsing the partially completed fusion assembly in acetone four times.

Electrical tests were performed to determine the reverse current leakage and the reverse voltage of the partially completed fusion assembly. Upon passing the electrical check, the fusion assembly was placed in a mixed silane solution. The temperature of the solution of 112° C.±2° C. and the solution consisting of 75 parts by volume of diphenyldichlorosilane and 25 parts by volume of methyl trichlorosilane in 1000 parts by volume of xylene. The fusion assembly remained in the solution for ½ hour and was then vacuum baked for one hour at a temperature of 180° C.±5° C. This process resulted in the coating 128 of cross linked linear polymers of diisodophenyldichlorosilane on the exposed surface 118 of the body 102 thereby passivating the surface.

The fusion assembly was removed from the vacuum baking process and a coating of an aromatic polyimide was applied over the passivated surface layer 128. The aromatic polyimide coating was applied by painting on a varnish-like material made by dissolving polypyromellitamic acid in dimethylacetamide, the varnish-like material having 48 percent solids present.

The fusion assembly with the applied varnish-like polyimide material was placed in an air circulating oven and baked in the following temperature cycle:

1 hour at 100° C.
½ hour at 150° C.
½ hour at 200° C.
4 hours at 250° C.
10 minutes at 300° C.

A cured, solid, infusible and insoluble coating forming the layer 130 resulted which adhered very well to the layer 128. The layer of polyimide was clear and flexible and had a dielectric strength of $2.3\times10^6$ volts per centimeter at 200° C. after 200 hours of aging in air at 325° C.

All of the semiconductor elements made in accordance with the teaching of this invention may be encapsulated by any suitable means known by those skilled in the art. Preferably, the semiconductor elements may be encapsulated in Compression Bonded Encapsulated electrical device. The semiconductor elements may be made for employment as diodes having an electrical contact to each of the two regions of semiconductivity of the body of semiconductor material or as an element having three or more electrical contacts, each contact being to a different region of semiconductivity of the body.

Figure 5:
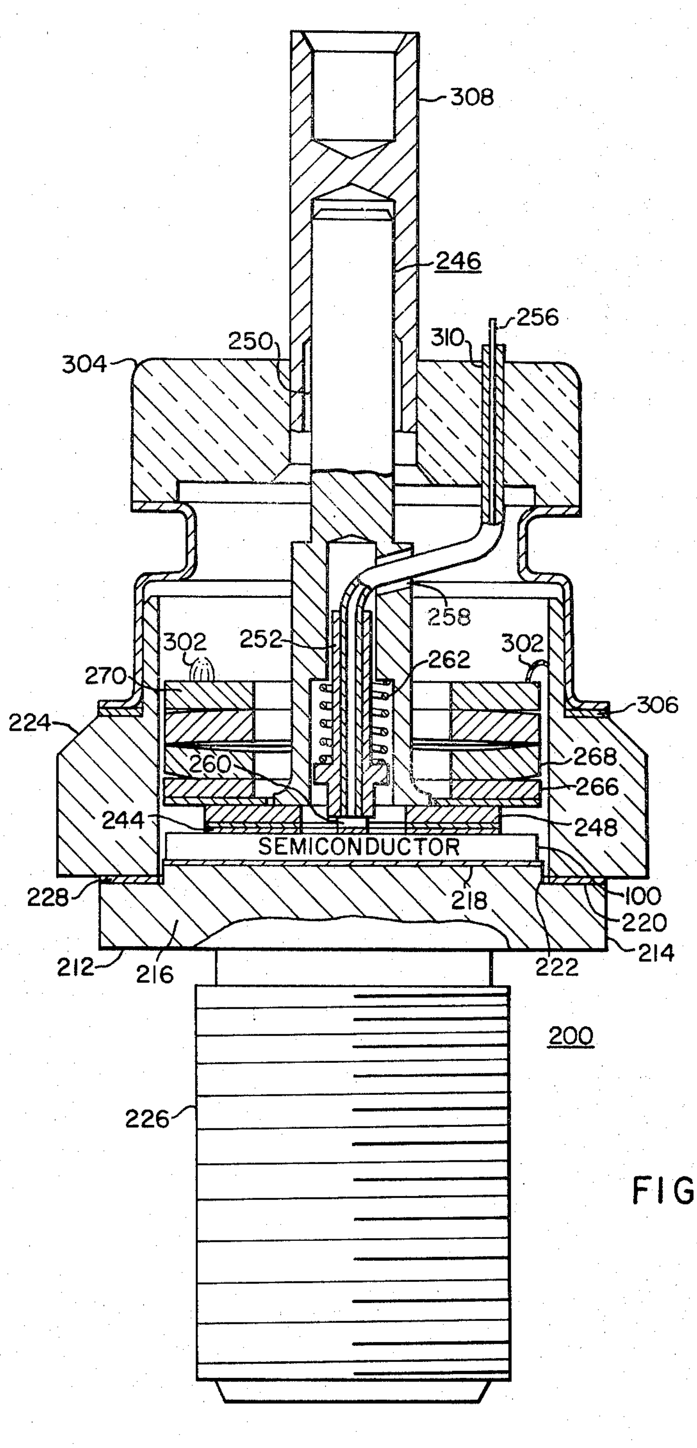
FIG. 5 is a view, partly in cross-section, of an electrical device embodying a semiconductor element processed in accordance with the teachings of this invention.

Referring now to FIG. 5, there is shown a typical semiconductor electrical device 210 embodying the fusion assembly 100. The device 210 is comprised of an electrically and thermally conductive support member 212 consisting of a metal selected from the group consisting of copper, silver, aluminum, base alloys thereof, and ferrous base alloys. The support member 212 has a peripheral flange 214 and an upwardly extending pedestal portion 216. The upwardly-extending pedestal portion 216 has an uppermost mounting surface 218. The peripheral flange 214 has a top surface 220 and the upwardly extending pedestal portion 216 has a peripheral side surface 222.

An upwardly-extending hollow, or tubular, member 224 consisting of a ferrous base material is affixed to the support member 212. The inner periphery of the member 224 conforms to the peripheral surface 222 of the pedestal portion 216. The member 224 is affixed to the support member 212 by any suitable means known to those skilled in the art, such, for example, as by disposing a suitable braze material between the top surface 220 of the flange 214 and the side surface 222 of the pedestal portion 216 and a portion of the inner periphery and part of the bottom surface of the member 224.

An electrical contact and thermal dissipating stud 226 is either affixed to, or is integral with, the support member 212 to connect the support member 212 to one electrical conductor and for mounting the device 210.

A non-reactive, malleable, electrically and thermally conductive layer 228 of a metal selected from the group of metals consisting of gold, silver, tin, indium, lead, and aluminum is disposed on the uppermost mounting surface 218 of the member 212. The layer 228 compensates for, and conforms to, any surface irregularities which may occur on the surface 218.

The semiconductor fusion assembly 100 is disposed in the layer 228, the contact 224 being in an electrically and thermally conductive relationship with the layer 228.

An apertured malleable layer 244 of an electrically and thermally conductive metal, such, for example, as one of those comprising the layer 228, is disposed on the contact 240 of the fusion assembly 100. The purpose of the layer 244 is the same as that of the layer 228.

A multiple electrical contact assembly 246 is disposed partly on the second malleable layer 244. The contact assembly 246 comprises such suitable materials and components necessary for a pressure electrical contact assembly such, for example, as a molybdenum washer 248 brazed to a hollow electrical connector 250 extending upwardly from the washer 248. An electrically insulating bushing 252 is slidably mounted inside the hollow portion of the connector 250.

A first electrical lead 256, suitably protected by a layer of electrically insulating material, as required, extends through a slot 258 in the sidewall of the hollow connector 250 and down through the center of the hollow portion terminating in a button-shaped contact member 260. A force is applied and maintained on the button-shaped contact member 260 by means of a resilient force means 262 positioned within the connector 250 and acting on the peripheral shoulder of the bushing 252, the bushing in turn acting on the contact 260. The contact member extends through the aperture of the layer 44 and is disposed on the contact 22 of the fusion assembly 100.

An electrical insulating washer 264 is placed over the partially hollow connector 250 of the contact assembly 246 and disposed on the washer 248. A first metal thrust washer-like member 266 is disposed on top of the insulating washer 264. At least one resilient member, such, for example, as a convex spring washer 268 is placed over the hollow connector 250 and disposed on the thrust washer 266. A second metal thrust washer-like member 270 is placed over the hollow connector 250 and disposed on the spring washer 268.

Three or more protrusions 272 formed by deforming portions of the member 224 act on the member 270 which in turn acts on the convex spring washers 268 to resiliently urge the multiple contact assembly 246, the fusion assembly 100, and the support member 212 into a pressure electrical and thermally conducting relationship. The applied force forces the washer 248 into a pressure electrical contact with the electrical contact 124 of the fusion assembly 100. At the same time, a pressure electrical contact is made between the contact 260 and the contact 122 of the fusion assembly 100 by means of the spring 262 acting on the slidable insulator 252.

The device 200 is completed by hermetically sealing the fusion assembly 100 within a header assembly 304 affixed to a weld ring 306 formed on the member 224. The connector 250 is electrically connected to an electrical connector 308 hermetically sealed in the assembly 304. The lead 256 is electrically connected to the hollow connector 310 hermetically sealed within the assembly 304 thereby completing the hermetic sealing of the fusion assembly 100.

The fusion assembly 100 is also suitable for use in flat packaged semiconductor devices.

We claim as our invention:

1. A semiconductor element comprising a body of semiconductor material having at least two regions of opposite type semiconductivity and a P-N junction between each pair of regions of opposite type semiconductivity;

an end portion of at least one P-N junction exposed at a surface of said body;

a layer of a cross-linked silicone polymer bonded to the surface of said body whereat said end portion of said at least one P-N junction is exposed and having a unit structure having at least one radical selected from the group consisting of monovalent alkyl, aryl, alkyl iodide, and aryl iodide is attached to the silicon atoms.

2. The semiconductor element of claim 1 including a layer of a protective coating material selected from the group consisting of room temperature vulcanizing rubbers, solid perfluorohydrocarbons, parylene, cured resinous aromatic polyimide, cured resinous aromatic polyamide-polyimide and cured resinous benzimidazole-imide copolymer disposed on the layer of cross-linked silicone polymers.

3. The semiconductor element of claim 2 in which, when the layer of protective coating material is an aromatic polyimide or an aromatic polyamide-polyimide, a sequestering agent is distributed throughout the layer of protective coating material.

4. The semiconductor element of claim 3 in which the sequestering agent is alizarin.

5. The semiconductor element of claim 2 in which the layer of protective resinous coating material includes an electrically insulating material comprising at least one finely divided material selected from the group consisting of aluminum oxide, aluminum nitride, silicon dioxide, silicon nitride, boron nitride, magnesium oxide, glass fibers, quartz, mica, and reactivated polytetrafluoroethylene.

6. A semiconductor element comprising a body of semiconductor material having at least two regions of opposite type semiconductivity and a P-N junction between each pair of regions of opposite type semiconductivity;

an end portion of at least one P-N junction exposed at a surface of said body; and at least one layer of a protective coating material disposed on the exposed end portion of the at least one P-N junction, said layer comprising a cured resin of a benzimidazoleimide copolymer.

7. The semiconductor element of claim 6 including a layer of an electrically insulating material selected from the group consisting of aluminum nitride, aluminum oxide, silicon oxide, silicon nitride, boron nitride, magnesium oxide, and silicon oxide-silicon nitride deposited on the exposed end portion of the at least one P-N junction and beneath the layer of protective coating material.

8. The semiconductor element of claim 6 including a finely divided electrically insulating material selected from the group consisting of aluminum oxide, silicon oxide, silicon nitride, glass fibers, boron nitride, quartz, mica, magnesium oxide, and reactivated polytetrafluoroethylene uniformly distributed throughout the layer of protective coating material.

9. The semiconductor element of claim 7 including a finely divided electrically insulating material selected from the group consisting of aluminum oxide, aluminum nitride, silicon oxide, silicon nitride, glass fibers, boron nitride, quartz, mica, magnesium oxide, and reactivated polytetrafluoroethylene uniformly distributed throughout the layer of protective coating material.

References Cited

UNITED STATES PATENTS

| | | | |
|---|---|---|---|
| 2,913,358 | 11/1959 | Harrington et al. | 148—33.3 X |
| 3,160,520 | 12/1964 | Jantsch et al. | 148—33.3 |
| 3,270,256 | 8/1966 | Mills et al. | 317—234 E |
| 3,271,638 | 9/1966 | Murad | 317—234 E |
| 3,284,678 | 11/1966 | McBride | 317—234 E X |
| 3,316,465 | 4/1967 | Von Bernuth et al. | 148—33.3 X |
| 3,373,051 | 3/1968 | Chu et al. | 148—33.3 X |
| 3,411,122 | 11/1968 | Schiller et al. | 317—234 E X |
| 3,444,440 | 5/1969 | Bell et al. | 317—234 E |
| 3,447,975 | 6/1969 | Bilo et al. | 148—33.3 |

L. DEWAYNE RUTLEDGE, Primary Examiner

J. M. DAVIS, Assistant Examiner

U.S. Cl. X.R.

117—201; 317—234 E